United States Patent
Le Phan

(10) Patent No.: US 7,277,317 B2
(45) Date of Patent: Oct. 2, 2007

(54) MRAM ARCHITECTURE FOR LOW POWER CONSUMPTION AND HIGH SELECTIVITY

(75) Inventor: Kim Le Phan, Eindhoven (NL)

(73) Assignee: NXP B.V., Eindhoven (NL)

( * ) Notice: Subject to any disclaimer, the term of this patent is extended or adjusted under 35 U.S.C. 154(b) by 129 days.

(21) Appl. No.: 10/543,396

(22) PCT Filed: Jan. 14, 2004

(86) PCT No.: PCT/IB2004/050022

§ 371 (c)(1),
(2), (4) Date: Jul. 26, 2005

(87) PCT Pub. No.: WO2004/068498

PCT Pub. Date: Aug. 12, 2004

(65) Prior Publication Data

US 2006/0087879 A1    Apr. 27, 2006

(30) Foreign Application Priority Data

Jan. 31, 2003  (EP) .................................. 03100211

(51) Int. Cl.
*G11C 11/00* (2006.01)
(52) U.S. Cl. ...................... 365/158; 365/158
(58) Field of Classification Search ................ 365/158, 365/171, 173; 438/3
See application file for complete search history.

(56) References Cited

U.S. PATENT DOCUMENTS

| | | | | |
|---|---|---|---|---|
| 5,477,482 A | * | 12/1995 | Prinz ........................... | 365/129 |
| 6,147,922 A | * | 11/2000 | Hurst et al. ............... | 365/225.5 |
| 6,391,483 B1 | * | 5/2002 | Zhu et al. .................... | 428/810 |
| 6,552,926 B2 | * | 4/2003 | Komori ....................... | 365/158 |
| 6,577,528 B2 | * | 6/2003 | Gogl et al. .................. | 365/158 |

* cited by examiner

*Primary Examiner*—Amir Zarabian
*Assistant Examiner*—Anthan Tran
(74) *Attorney, Agent, or Firm*—Peter Zawilski

(57) ABSTRACT

The present invention provides a magnetoresistive memory cell (30), comprising a magnetoresistive memory element (31), a first current line (32) and a second current line (33), the first and the second current line (32, 33) crossing each other at a cross-point region but not being in direct contact. According to the invention, a bridging element(34) connects the first and second current lines (32, 33) in the vicinity of the cross-point region. The bridging element (34) is magnetically couplable to the magnetoresistive memory element (31). An advantage of the MRAM architecture according to the present invention is that it allows lower power consumption than prior art devices and high selectivity during writing. The present invention also provides a method of writing a value in a matrix of magnetoresistive memory cells (30) according to the present invention, and a method of manufacturing such magnetoresistive memory cells (30).

11 Claims, 9 Drawing Sheets

MRAM ARCHITECTURE FOR LOW POWER CONSUMPTION AND HIGH SELECTIVITY

The present invention relates to magnetic or magnetoresistive random access memories (MRAMs), and more particularly to an MRAM architecture that allows low power consumption and high selectivity during writing as well as methods of operating the same.

Magnetic or Magnetoresistive Random Access Memory (MRAM is currently being considered by many companies as a successor to flash memory. It has the potential to replace all but the fastest static RAM (SRAM) memories. It is a non-volatile memory device, which means that no power is required to sustain the stored information. This is seen as an advantage over most other types of solid-state memory.

The MRAM concept was originally developed at Honeywell Corp. USA, and uses magnetization direction in a magnetic multilayer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize a.o. non-volatile magnetic memories. These devices comprise a stack of thin films of which at least two are ferromagnetic or ferrimagnetic, and which are separated by a non-magnetic interlayer. GMR is the magneto-resistance for structures with conductor interlayers and TMR is the magneto-resistance for structures with dielectric interlayers. If a very thin conductor is placed between two ferromagnetic or ferrimagnetic films, then the effective in-plane resistance of the composite multilayer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as a percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 10-14% magneto-resistance in good GMR cells.

A typical MRAM device comprises a plurality of magnetoresistive memory elements, e.g. MTJ elements, arranged in an array. MTJ memory elements generally include a layered structure comprising a fixed or pinned layer, a free layer and a dielectric barrier in between. The pinned layer of magnetic material has a magnetic vector that always points in the same direction. The magnetic vector of the free layer is free, but constrained within the easy axis of the layer, which is determined chiefly by the physical dimensions of the element. The magnetic vector of the free layer points in either of two directions: parallel or anti-parallel with the magnetization direction of the pinned layer, which coincides with the said easy axis. Word lines extend along rows of memory elements, and bit lines extend along columns of memory elements. The word lines and bit lines are patterned separately into two metal layers under and above the MTJ stack. Each memory element is located at a cross-point region of a word line and a bit line. The bit lines are, for example, parallel with the hard axis of the memory elements, which creates a magnetic field in the direction of the easy axis, while the word lines are then parallel with the easy axis of the memory elements, which creates a magnetic field in the direction of the hard axis.

Writing is done by simultaneously applying current pulses through the bit and the word lines that intersect at a selected cell. At the intersection region, i.e. the zone between a word line and a bit line where both overlap each other, a peak magnetic field is generated, sufficient to switch the polarization of the free layer of the MTJ element, so as to switch the resistance of the MTJ element from the LoRes (low resistance) state to the HiRes (high resistance) state or vice versa (depending on the direction of the current through the bit line). The currents in the selected word line and the selected bit line are such that only together they provide a magnetic field able to change the direction of the magnetic vector of the free layer of the selected memory element, but the current in either line by itself is not able to change the storage state. Therefore only the selected memory element is written, not any of the other memory elements on the same selected word line or bit line. If the magnitudes of the magnetic fields generated by either current line are the same, the direction of the resultant magnetic field makes an angle of 45° with respect to the easy axis of the free layer of the cell. At this angle, the switching field of the free layer is the smallest, as shown by the astroid curve in FIG. 1, thus writing can be done with the least current in both lines. The magnitude of the resultant magnetic field at the crossing point is:

$$\frac{|H_{HA}| + |H_{EA}|}{\sqrt{2}}, \text{ with } |H_{HA}| = |H_{EA}|$$

in which $H_{HA}$ and $H_{EA}$ are the fields created in the hard axis and easy axis direction, respectively. The end point of the field vector applied to the magnetoresistive element must be on or outside the astroid curve in order to switch the magnetization of the free layer.

On the one hand, the currents in the selected bit line and word line must be chosen in such a way that the total field sufficiently exceeds the switching field of the addressed cell at 45° with the easy axis, or in other words, so that the end of the resultant field vector is on or outside the astroid branch in this direction (see FIG. 1). On the other hand, the magnitude of the field created by only the bit line itself must be significantly smaller than the switching fields in the easy axis direction of any of the cells lying on the same bit line to prevent undesired over-writing. In other words, if it is supposed that the field created by the bit line is $H_{EA}$, the switching fields of the free layer in the direction of the easy axis of all cells must be well confined within the following window:

$$H_{EA} < H_s < H_{EA} * 2\sqrt{2}$$

in order to have a good writing selectivity. Equivalently, the selectivity window can be expressed as:

$$H_{s\text{-}min} < H_s < H_{s\text{-}max}$$

with $H_{s-max}=2.8*H_{s-min}$. Here $H_{s-min}$ and $H_{s-max}$ are the permitted minimum and maximum switching fields of the free layer in the easy axis direction. The distribution width of the switching field must be well confined within these two values. The selectivity window is represented by the shaded area in FIG. 2. This means the astroid curves of all cells must be well confined within this area.

One problem of the conventional design is that the selectivity is rather low. It is technically difficult to fabricate millions of cells with narrow distribution in switching field because the variation in sizes of tunnel junction elements can be rather significant with small structures.

A disadvantage with conventional MRAM devices is that the method to create magnetic field with a straight conductor is the most ineffective way. The programming current needed is high, because of the requirement of two high enough magnetic fields being induced in the neighborhood of the magnetoresistive material. The field is created equally at any point along the line, but only at the intersection point it is actually used. In demos by IBM and Motorola, 0.6 μm CMOS technology proves to give stable read and write operations using currents in the 5 to 10 mA range. Typical devices in these demonstrations were about 0.1 to 0.5 $\mu m^2$.

Magnetic fields are created on-chip by sending a current through bit or word lines, in general called current lines, and are proportional to the current. For obtaining higher magnetic fields, higher currents need to be used. However, low power applications will require low currents. Those are contradictory requirements. It would be advantageous to obtain higher selectivity while using lower currents.

This problem is solved in U.S. Pat. No. 6,385,083 by providing an array of memory cells and a plurality of conductors, also called word lines and bit lines, which run orthogonal with respect to each other. The word lines lie at one side of the array of memory cells, and the bit lines lie at the opposite side of the array of memory cells. The word lines extend in a first direction, and are offset in a second direction from at least some of the memory elements, the first and second directions being orthogonal. By doing this, each memory cell is located between, and overlapped by, two adjacent word lines. Each memory cell is electrically connected to a bit line and one of the adjacent word lines. In this architecture, a memory cell can change its state when it sees combined magnetic fields from three lines, one selected bit line and two word lines adjacent to the selected memory cell. The magnetic field generated by current in either conductor alone, or the combined magnetic field generated by current in two of those conductors, is not strong enough to change the magnetization orientation of the selected memory cell. This solution, although improving the selectivity, does not really reduce the power consumption, as current needs to be sent through more current lines.

It is an object of the present invention to provide an MRAM architecture and method of operating the same which provides a high selectivity during writing, while having a low power consumption.

The above objective is accomplished by a device and method according to the present invention.

The present invention provides a magnetoresistive memory cell, comprising a magnetoresistive memory element, a first current line and a second current line, the first and the second current line crossing each other at a crosspoint region but not being in direct contact. According to the present invention, a bridging element connects the first and second current lines in the vicinity of the cross-point region, and the bridging element is magnetically couplable to the magnetoresistive memory element. An advantage of such magnetoresistive memory cell according to the present invention is that a low current can be used to obtain a magnetic field in the magnetoresistive element, which is large enough to switch the polarization state of a free layer of the magnetoresistive element.

The bridging element may comprise at least a first component which lies in a plane parallel to the first and second current lines and at least one second component which is perpendicular thereto. The first component may be for example a strip patterned in a metal layer, and the second component may be for example a via or a plug. There may be more than one second component. If the bridging element comprises one first component and two second components, the bridging element may be U-shaped. This has the advantage that the magnetic field created by current flowing through the U-shaped bridging element is enhanced and concentrated at the magnetoresistive element, if this magnetoresistive element is placed at the center point of the bridging element. If the bridging element comprises one first component and only one second component, the bridging element may be L-shaped. The field created by current flowing through these first and second components is used for switching the magnetization direction of the memory element during writing. The resultant field orientation of the bridging element may be in any direction, but preferably is in-plane and at an angle such that the switching field of the free layer is the smallest, for example, at an angle of 45° from the easy axis of the free layer of the memory element.

The bridging element may be a conductive structure, so that current can flow through it, in order to generate the necessary magnetic field to write a value in the magnetoresistive element.

A magnetoresistive memory cell according to the present invention may comprise a separation device between the bridging element and the first current line or between the bridging element and the second current line. Alternatively a magnetoresistive memory cell according to the present invention may comprise a separation device in between components of the bridging element, for example in between the first component and the second component or one of the second components. The separation device, if present, must be somewhere in the current path between the first and the second current line. An advantage of such separation device is that it blocks sneak currents (i.e. currents flowing through alternate, undesired current paths) in unselected bridging elements, but does not block current in selected bridging elements.

The separation device may have a symmetrical and non-linear current-voltage characteristic, i.e. it is a bi-directionally conducting non-linear device. An advantage thereof is that it allows to write in two directions (generation of magnetic fields in two directions).

The separation device may comprise a sandwich of conductive material, barrier material and conductive material. The conductive material may be a metal material. The barrier material may be an insulator material or a semiconductor material. Alternatively, for example an n/p+/n structure or an n+/n−/p+/n−/n+ structure, or their complementary forms, can also be used as a separation device. The above-mentioned structures provide a symmetrical non-linear current-voltage characteristic, and any other structure that also provides such symmetrical non-linear current-voltage characteristic can also be used. When current is sent in any of two opposite direction through the separation device, the device has a symmetrical behavior.

In a magnetoresistive memory cell according to the present invention, the bridging element may have a center point, i.e. a point which is equidistant from all components of the bridging element. The magnetoresistive memory element may be located at the center point of the bridging element. This has the advantage that the generated magnetic field is concentrated at the memory element. The memory element may be located as close as possible to all components of the bridging element. By locating the magnetoresistive memory element at the center point of the bridging element, or as close as possible to all components of the bridging element, it may be located completely outside the cross-point region of the first and second current lines.

The present invention also provides a matrix of magnetoresistive memory cells, each magnetoresistive memory cell comprising a magnetoresistive memory element. The magnetoresistive memory cells are linked together to form logically organized rows and columns. Each row is provided with a first current line and each column is provided with a second current line. The first and the second current lines cross each other at cross-point regions, wherein bridging elements connect the first and second current lines in the vicinity of the cross-point regions. The bridging elements are magnetically couplable to the magnetoresistive memory elements.

Every memory cell of the matrix of magnetoresistive memory cells may be provided with a selection transistor, i.e. the memory cells are of the 1T1MTJ type. This allows for a faster reading, a larger signal and less noise.

Alternatively, every row of memory cells may be provided with a sense line. In this case the memory cells do not include selection transistors, i.e. they are of the 0T1MTJ type, and thus may have a smaller intrinsic cell size.

The present invention furthermore provides a method of writing a value in a matrix of magnetoresistive memory cells, each magnetoresistive memory cell comprising a magnetoresistive memory element, the magnetoresistive memory cells being linked together to form logically organized rows and columns, each row being provided with a first current line and each column being provided with a second current line, the first and the second current lines crossing each other at cross-point regions in the memory cells, each memory cell being provided with a bridging element conductively connecting the first current line and the second current line. The method comprises sending a current through a selected first current line, through a selected bridging element and through a selected second current line.

The bridging element may conductively connect the first current line and the second current line through a separation device, the method then furthermore comprising sending current through the separation device.

The present invention furthermore provides a method of manufacturing a magnetoresistive memory cell. The method comprises forming a first current line in a first metal layer, forming a second current line in a second metal layer, forming a first component of a bridging element in a third metal layer, and forming at least one second component of the bridging element by means of intermetal interconnects.

The manufacturing method may furthermore comprise forming a separation device between the bridging element and any of the first or second current line, or in between the bridging element components.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference numbers refer to the same or analogous elements.

Figure 1:
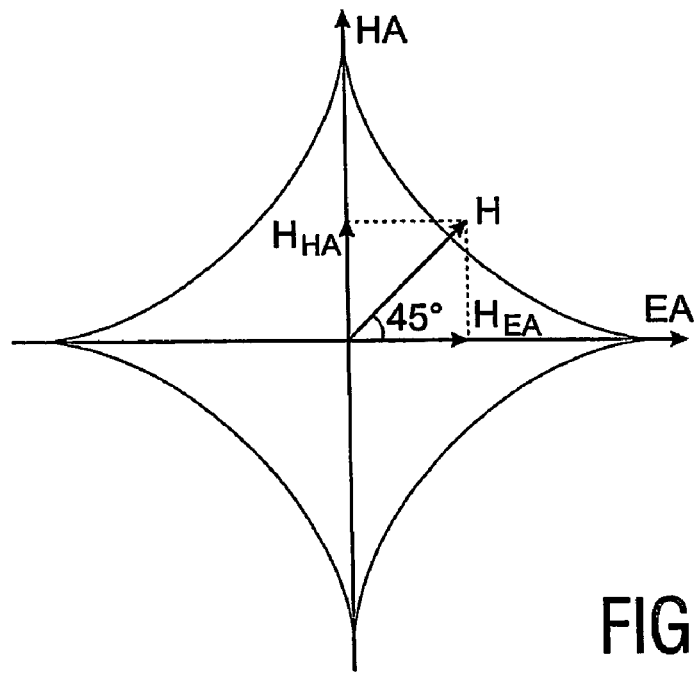
FIG. 1 is a diagram of an astroid curve showing the switching field of a free layer in a magnetoresistive memory cell, whereby the applied magnetic field must be on or outside the astroid curve in order to switch the magnetization of the free layer.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

According to the present invention, a matrix 40 of magnetoresistive memory cells 30 (see FIG. 4), each memory cell 30 comprising a magnetoresistive memory element 31, is logically organized in rows 41 and columns 42. Throughout this description, the terms "horizontal" and "vertical" are used to provide a co-ordinate system and for ease of explanation only. They do not need to, but may, refer to an actual physical direction of the device. Furthermore, the terms "column" and "row" are used to describe sets of array elements which are linked together. The linking can be in the form of a Cartesian array of rows and columns; however, the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organized rows and columns. By this is meant that sets of memory elements are linked together in a topologically linear intersecting manner; however, that the physical or topographical arrangement need not be so. For example, the rows may be circles and the columns may be radii of these circles and the circles and radii are described in this invention as "logically organized" in rows and columns. Also, specific names of the various lines, e.g. bit line and word line, or row line and column line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

Figure 3:
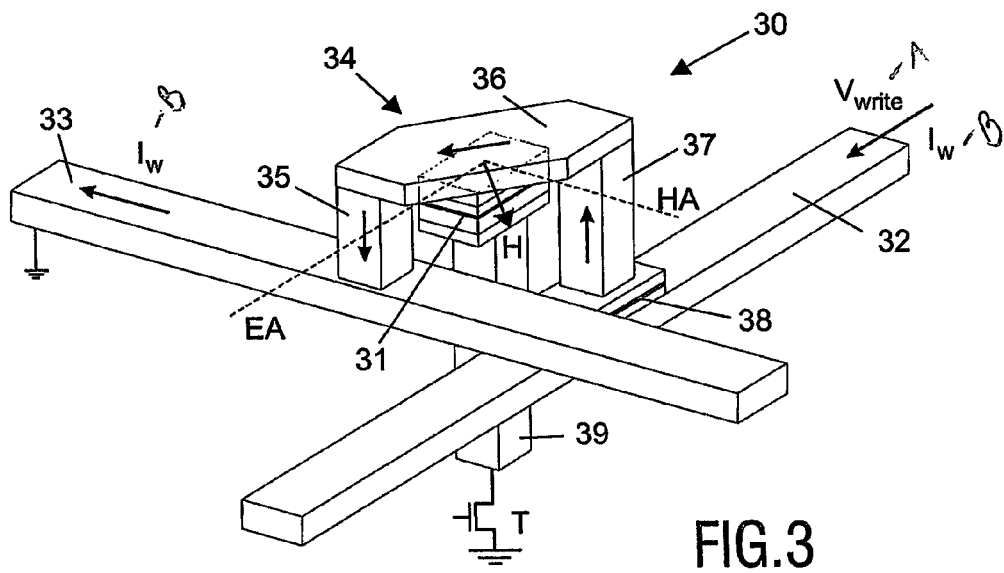
FIG. 3 is a perspective view of an MRAM memory cell according to a first embodiment of the present invention.

One memory cell 30 according to an embodiment of the present invention is represented in FIG. 3. An architecture according to the present invention may use an orthogonal grid of bit lines 32 (patterned in a first metal layer) and word lines 33 (patterned in a second metal layer). Alternatively, but not represented in the drawings, an architecture according to the present invention may use a grid of bit lines and word lines, where the bit lines and word lines include an angle different from 90°, as e.g. in US-2002/0097601. The embodiment with the bit lines and word lines including an angle of 90° is preferred as it leads to the smallest cell size. According to still another embodiment, not represented in the drawings nor further explained, the word lines may be in the first metal layer and the bit lines may be in the second metal layer, i.e. either the word lines are provided in a metal layer above the metal layer of the bit lines, or vice versa. The word lines 33 and bit lines 32 intersect at an intersection region or cross-point region, i.e. a zone where they cross or overlap each other without being in direct contact (as they are made in different metal layers).

A U-shaped bridge 34 is formed which connects the bit line 32 and the word line 33 in the vicinity of the intersection region. The bridge 34 comprises a plurality of components, e.g. bridge 34 consists of a first component formed by a first via 35, a second component formed by a top bar 36 (patterned in a third metal layer) and a third component formed by a second via 37. In between via 37 and bit line 32 there is a separation device 38 which serves as a separator to block sneak currents flowing through undesired paths.

According to another embodiment, not represented in the drawings, the separation device may be located in between via 35 and word line 33. The separation device must be provided in the current path between the word line 33 and the bit line 32. According to still another embodiment of the present invention, also not provided in the drawings, the separation device may be provided in between bridge components, e.g. between the first via 35 and the top bar 36, or between the second via 37 and the top bar 36.

The top bar 36 is oriented under an angle, such as e.g. 45°, with the bit line 32 and the word line 33. The angle is such that the normal of the bridge plane, i.e. the plane formed by the bridge components 35, 36, 37, is oriented at an angle at which the switching field is the minimum. The magnetoresistive memory element 31, e.g. MTJ stack, is located at the center of the U-shaped bridge 34, in between the second and the third metal layer, i.e. at a level which is higher than both the level of the bit line 32 and of the word line 33. In another, less preferred, embodiment of the present invention, not represented in the drawings, the magnetoresistive memory element may be placed in between the first and the second metal layer, i.e. at a level higher than either of the bit line and the word line, and lower than the other. However, this embodiment is less preferred, as less magnetic field generated by current flowing through the bridging element is sensed in the magnetic memory element, as it is further away from the top bar 36 and first via 35. In fact the magnetic field at the magnetic memory element is substantially only formed by the current in the second via 37.

The above arrangement, as represented in FIG. 3 is just an example, as indicated by the alternatives already given. Furthermore, the whole structure as drawn in FIG. 3 can be turned upside down, which means that the top bar 36 can be physically located at the bottom of the device, underneath the metal layers wherein the bit line and word line are formed.

MTJ memory element 31 generally includes a layered structure comprising a fixed or pinned layer, a free layer and a dielectric barrier in between. The MTJ memory element 31 furthermore comprises a non-magnetic conductor forming a lower electrical contact or bottom electrode, and an upper contact or top electrode on e.g. the free magnetic layer. The stack of free and pinned layers can also be reversed, so that the upper contact is on the pinned magnetic layer. The pinned magnetic layer and the free magnetic layer may be composed of e.g. NiFe or CoFe and the dielectric barrier layer may e.g. be made of AlOx. Moreover both free and pinned layers can be formed by a multilayer of different magnetic layers, also in combination with non-magnetic or antiferromagnetic layers. By applying a small voltage over the sandwich of ferromagnetic or ferrimagnetic layers with the dielectric therebetween, electrons can tunnel through the dielectric barrier.

The magnetoresistive element 31 is located outside the cross-point region of the bit line 32 and word line 33, i.e. outside the zone where bit line 32 and word line 33 cross each other. Because underneath the magnetoresistive memory element 31, e.g. MTJ stack, there is no conductive or metal line, a third via 39 can be placed there to connect the bottom electrode of the magnetoresistive memory element 31 down to a selection transistor T for read operation. The top electrode of the magnetoresistive element 31, e.g. MTJ stack, is in contact with the top bar 36.

Figure 4:
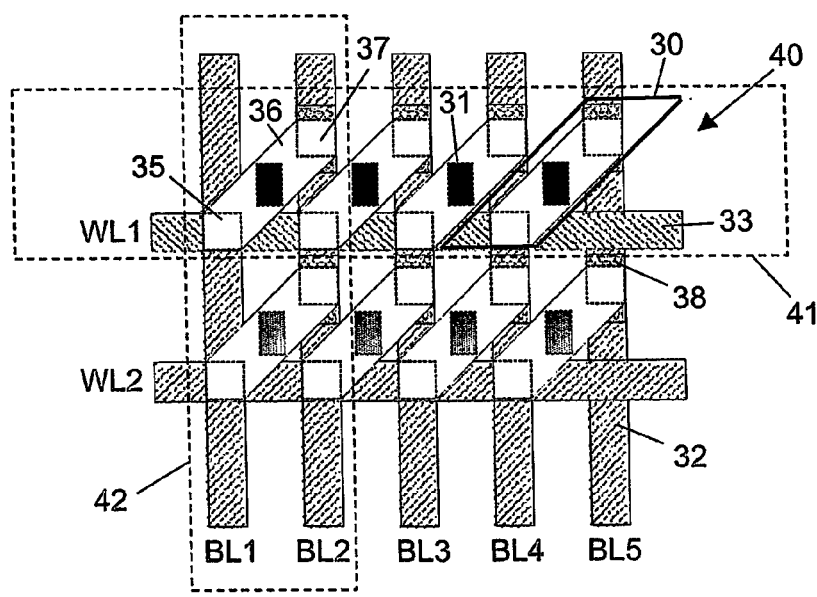
FIG. 4 is a top view of an MRAM memory comprising a plurality of memory cells as in FIG. 3.
Figure 5:
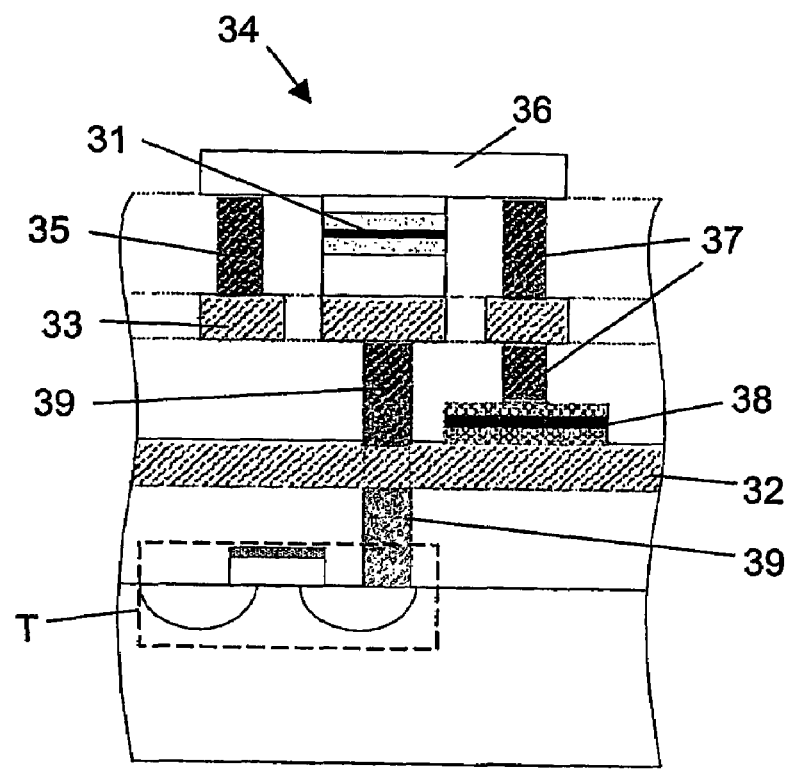
FIG. 5 is a side view of a memory cell as in FIG. 3.

A top view of the proposed architecture is shown in FIG. 4, and a side view is shown in FIG. 5. In fact, in order to maximize the limit of the current flowing through the separation device 38, the area of the separation device 38 in each cell 30 can be extended as much as possible, as long as it does not touch the third via 39 and the separation devices 38 of the neighboring cells 30.

Figure 6:
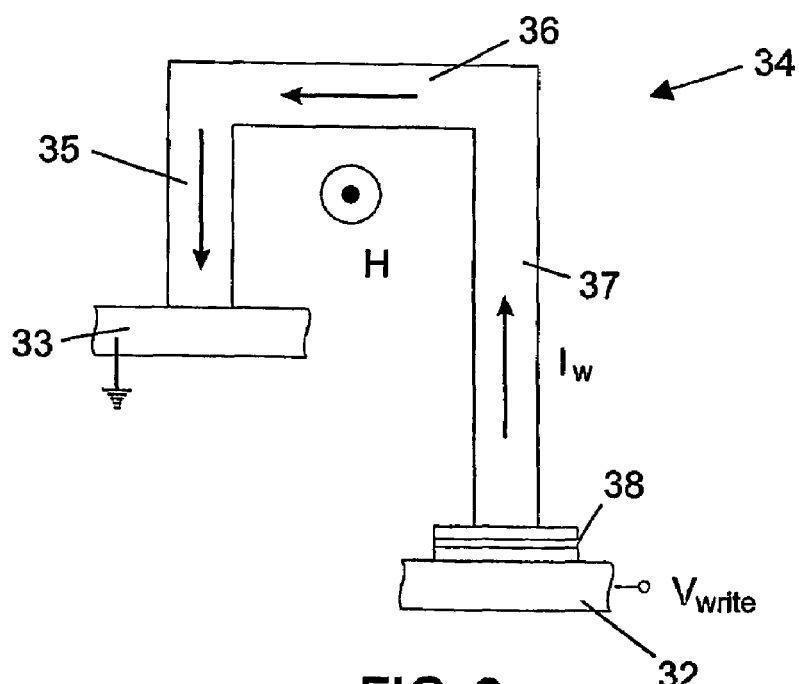
FIG. 6 is a simplified current flow diagram during writing of an MRAM memory cell as in FIG. 3.

Writing or storing a binary value, i.e. e.g. a "1" or a "0", into the memory element 31 of a memory cell 30 is done by grounding one end of the corresponding word line 33 while a pulsed voltage $V_{write}$ is applied on one end of the corresponding bit line 32, as shown in FIG. 3. A current pulse $I_w$ will flow from the bit line 32, through the separation device 38, the second via 37, top bar 36, first via 35 and finally through the word line 33 to the ground. This is also shown in FIG. 6. The current partly forms a loop which creates a magnetic field H according to the right hand rule. The field is oriented with respect to the easy axis at an angle which is the same as the angle included between the top bar 36 of the bridge 34 and the bit line 32 or word line 33, e.g. at 45°, due to the orientation of the bridge 34 with respect to the bit line 32 and the word line 33. The field strength is chosen in such a way that it exceeds the switching field of the free layer at that angle. Due to the shape of the bridge 34, the field created by the write current $I_w$ is enhanced and concentrated to the selected memory element 31. Writing in another direction is done by sending the current in the opposite direction. The current can hardly escape to other paths through unselected cells thanks to the separation devices 38.

Figure 7:
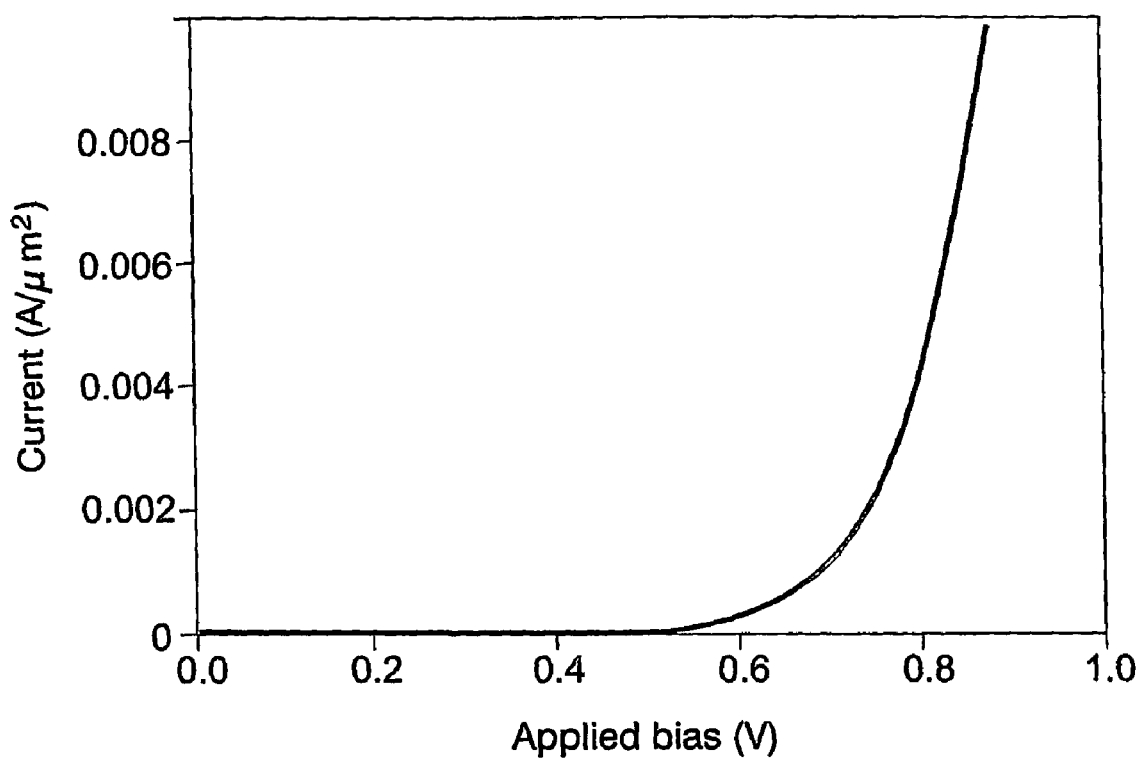
FIG. 7 illustrates the positive part of a current-voltage characteristic of a non-linear separation device, the characteristic being symmetrical with respect to the origin.

A separation device may consist of a sandwich structure of metal-barrier-metal, such as metal-insulator-metal, or metal-semiconductor-metal, as described in U.S. Pat. No. 6,331,944. The separation devices are deposited and patterned on top of the bit lines 32 or on top of the word lines 33. Basically, the separation device 38 can provide a non-linear current-voltage (I-V) characteristic which is symmetrical with respect to the origin. FIG. 7 shows the positive part of such an I-V curve according to U.S. Pat. No. 6,331,944. The current through the separation device 38 at a bias of $V_B$ (about 1 Volt) is more than ten times larger than that at a bias of ½ $V_B$. Therefore, the write current $I_w$ in FIG. 3 and FIG. 6 will mainly flow through the selected bridge 34 since most of the voltage drops on the separation device 38 directly connected to this bridge 34. Sneak currents flowing through unselected bridges 34 lying on the same selected bit line 32 or selected word line 33 are at least more than ten times smaller than the current flowing through the selected bridge 34 because on unselected separation devices 38, the voltage drop is only half of that on the selected device. The current flowing through the rest of unselected cells in the array are extremely small because the current is further split. This can be explained as follows: the sneak current first goes from an e.g. selected bit line to the unselected cells that connect directly to that bit line, then splits through many paths (the larger the array, the more paths possible) before going through the unselected cells that connect directly to a selected word line, and then finally goes to that word line. Therefore, the total resistance of all sneak paths through all cells that are not directly connected to the selected bit or word line are considered zero (shorted). This leads to the simplified diagram in FIG. 10, in which one can clearly see that the voltage drops on each $R_{unselect}$ are (about) half of that on the $R_{select}$, if $R_{connect}$ is considered negligible.

The separation device 38 should have a symmetrical I-V characteristic, i.e. it should be a bi-directionally conducting non-linear device, because in order to be able to write in both directions (i.e. generating magnetic field in both directions), the device must have symmetrical behaviors when the current is sent in any of the opposite directions. Besides the metal-barrier-metal structure as mentioned hereinabove, other structures that also provide a symmetrical non-linear behaviors, such as an n/p+/n structure and an n+/n−/p+/n−/n+ structures and their complementary forms are also possible, as also mentioned in U.S. Pat. No. 5,991,193.

Reading of the content of memory element 31 is done in a manner similar to conventional designs. A sense current is sent via a selected word line 33, first via 35, top bar 36 of the bridge 34, through the magnetoresistive memory element 31, e.g. MTJ stack, third via 39 and ends up in the selection transistor T, which is now in the ON state.

The architecture of the memory cells according to the present invention allows to obtain sufficient write field with significantly less current. This is because the total write field is a sum of fields created by three segments 35, 36, 37 of the U-shaped bridge 34 and this total field is already oriented in the direction of minimum switching field, e.g. at 45° with respect to the easy axis of the magnetoresistive element 31. The power consumption is further reduced because only one current pulse instead of two is sent during writing, the same current flowing through both the bit line 32 and the word line 33. In addition, as a statistic average, the current $I_w$ has to flow through only half of the bit line 32 and word line 33, which can reduce some resistance of the lines 32, 33. The following rough calculations show that the present invention offers much power consumption reduction.

Figure 8:
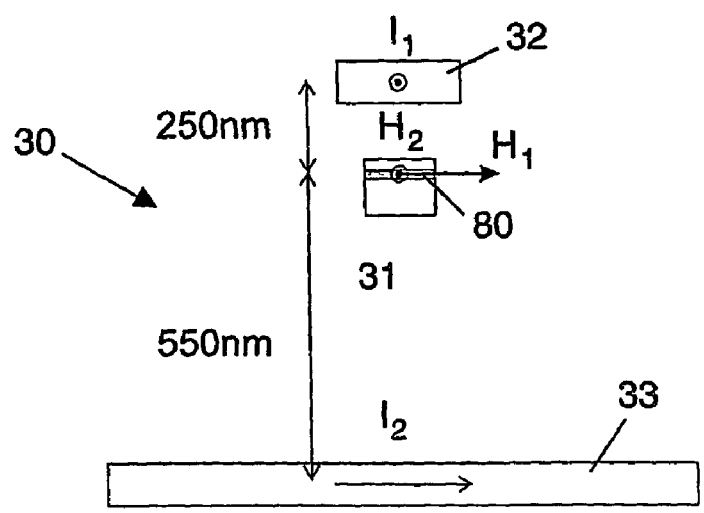
FIG. 8 is a simplified side view of a prior art magnetoresistive memory cell.

Calculations for a conventional design (FIG. 8):

It is supposed that the free layer 80 is located at distances of 250 nm and 550 nm away from the bit line 32 and the word line 33, respectively. According to the Biot-Savart law, the magnetic field at the free layer 80, created by a current $I_1$ in the bit line 32 is $$H_1\left[\frac{A}{m}\right] = 6.37*10^5 \; I_1[A]$$

and the magnetic field at the free layer 80 created by a current $I_2$ in the word line 33 is $$H_2\left[\frac{A}{m}\right] = 2.89*10^5 \; I_2[A]$$

Figure 9:
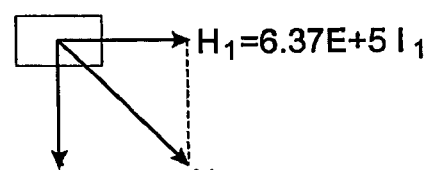
FIG. 9 is a simplified top view of the prior art magnetoresistive memory cell as in FIG. 8.

In order to keep the resultant field $H_{convent}$ at 45°, $I_2$ must be 2.2*$I_1$ (FIG. 9) because the distances between the bit line 32 and the free layer 82 and between the word line 33 and the free layer 80 are different. Finally, the resultant field, expressed in terms of $I_1$, at 45° is:

$$H_{convent} = \frac{H_1}{\sqrt{2}} + \frac{H_2}{\sqrt{2}} = 9.03*10^5 \; I_1.$$

The power consumption is:

$$P_{convent} = R_{line}*(I_1^2 + I_2^2) = 5.84*R_{line}*I_1^2,$$

in which $R_{line}$ is the resistance of either a word line 33 or a bit line 32, the resistances of both lines 32, 33 supposed to be the same for this calculation.

Calculations for the design of an embodiment of the present invention (FIG. 6):

It is supposed that the U-shaped bridge 34 comprises a 800 nm long first via 35, a 300 nm long top bar 36 and a 1600 nm long second via 37. The free layer 80 is located underneath the top bar 36 at a distance of 150 nm. This means the distance between metal layers (first and second metal layers in which the bit lines 32 and word lines 33 are patterned) is kept the same as in the conventional case (800 nm) for the sake of comparison. The total field created by the bridge 34 at 45° with respect to the easy axis, according to the Biot-Savart law, is $H_U=2.55*10^6 I_w$, where $I_w$ is the write current in this case. In the calculation, the fields created by the three segments (first via 35, top bar 36, second via 37) are added together.

In order to obtain the same field as in the conventional case (for comparison), $H_U$ is set to be equal to $H_{convent}$. Then:

$$2.55*10^6 I_w = 9.03*10^5 I_1, \text{ or } I_w = 0.35 I_1.$$

This means that with the new design, only 35% of the current has to be sent through a bit line 32 and a word line 33 in order to obtain the same field in the free layer 80 compared to the conventional design. Moreover, in this case only one current $I_w$ is needed, while in the conventional design, two currents $I_1$, $I_2$ are needed.

Figure 10:
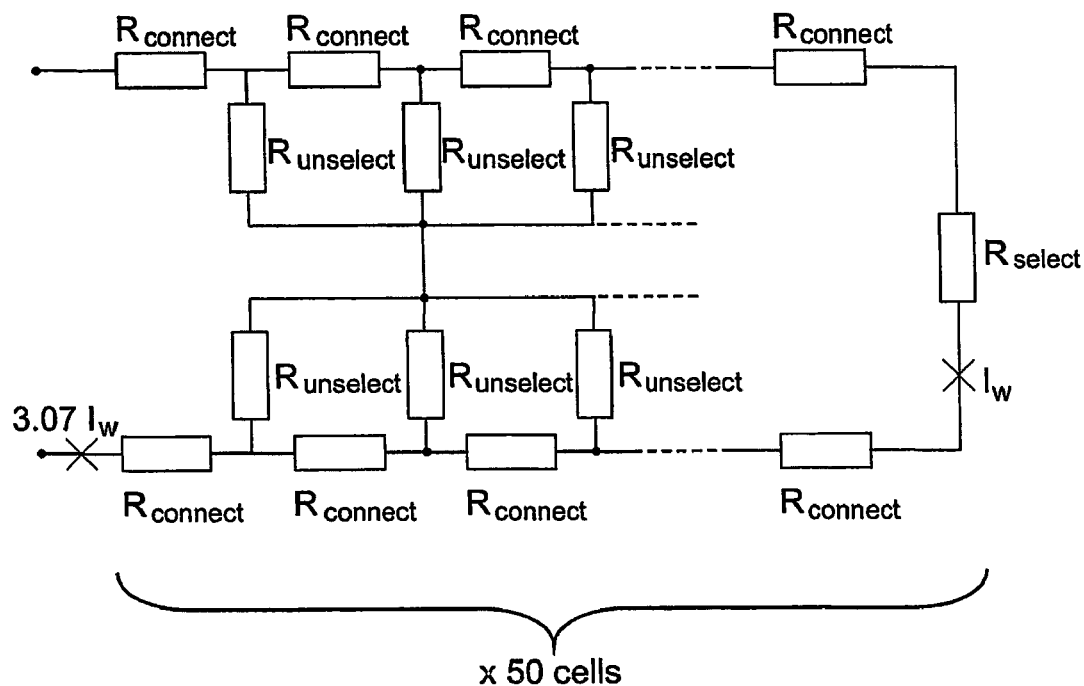
FIG. 10 is a simplified circuit diagram of a 100×100-cell array according to the present invention.

To calculate power consumption in the new design, a schematic circuit diagram of an array of 100 by 100 cells is simplified and shown in FIG. 10. In this diagram, only the components that are involved in the write operation are included, i.e. bit lines 32, word lines 33 and separation devices 38. The resistors $R_{select}$ and $R_{unselect}$ are resistances of the separation devices 38 at the selected and unselected memory cells 30. Because $R_{unselect}$ is biased at half voltage of that on $R_{select}$, according to the non-linear behavior of the separation device 38, it can be supposed that $R_{unselect}$ is for instance $12.5*R_{select}$. The resistance $R_{select}$ is set approximately to $R_{line}$, which is practically reasonable. The sneak paths mainly go through all unselected memory cells 30 directly connected to the selected bit line 32 and word line 33. All other memory cells 30 are considered shorted. The resistance of the part of the bit lines 32 and word lines 33 in between two adjacent cells ($R_{connect}=1/100\ R_{line}$) is also taken into account, which is necessary for comparison with the calculations for the conventional case.

Statistically, an average write current has to travel half of a bit line 32 and half of a word line 33. Therefore, the calculation considers an average case where the selected memory cell 30 is located at the middle of the array.

The calculations reveal that in the case shown in FIG. 10, the current flowing through $R_{select}$, i.e. $I_w$, is 3.07 times smaller than the total current supplied to the circuit and the total resistance of the circuit is $0.38*R_{line}$. Consequently, the power consumption in this case is:

$$P_U = 0.38*R_{line}*(3.07*I_w)^2$$

To compare to the conventional case, $I_w$ is set to $0.35*I_1$ to obtain the same field. This results in:

$$P_U = 0.38*R_{line}*(3.07*0.35*I_1)^2$$
$$= 0.44*R_{line}*I_1^2$$

Compared to the conventional design, the present design can save $5.84/0.44=13.3$ times of power consumption.

Selectivity of the architecture of embodiments of the present invention is significantly higher than that of the conventional one. This is due to the fact that the write field is concentrated only at the U-shaped bridge 34 and oriented under 45° with respect to the easy axis, at which the switching field is the lowest. On the other hand, the field created by a selected bit line 32, but applied to unselected cells lying on the same bit line 32, is very small because the bit line 32 is deeply buried under the magnetoresistive element 31, e.g. MTJ stack, and this field is oriented at 0° with respect to the easy axis, at which the switching field is the highest. The following calculations reveal more.

According to the field calculations above, field created at the free layer 80 inside the U-shaped bridge 34 (at the selected memory cell 30) at 45° is $2.55*10^6 I_w$, that means the maximum switching field of the cells at this angle should not exceed this value. Consequently, the maximum switching field at 0° should not exceed $2*2.55*10^6 I_w=5.1*10^6 I_w$ (according to the astroid curve, the switching field $H_s$ at 45° is half of that at 0°).

Figure 11:
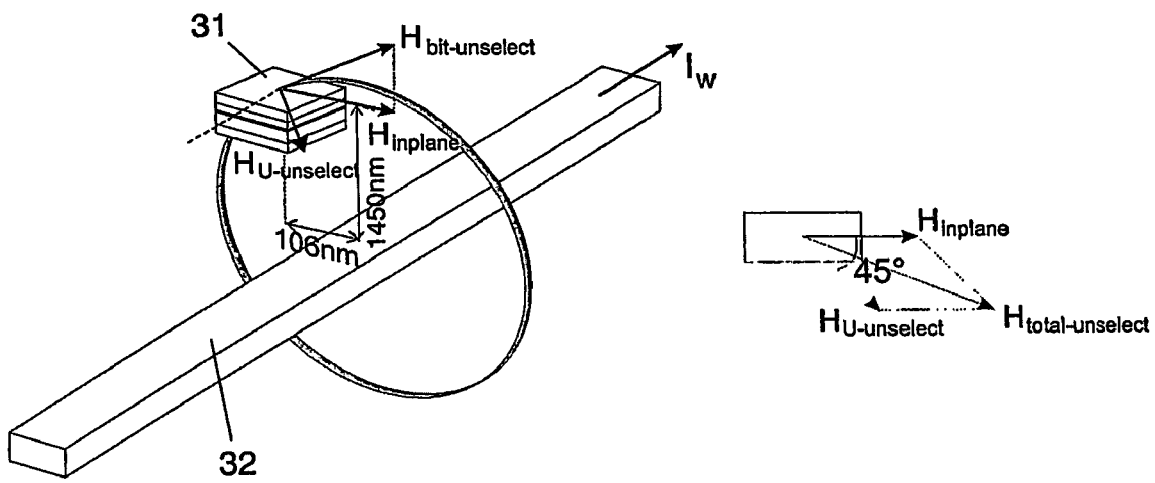
FIG. 11 is a simplified diagram for calculating the field applied to unselected cells according to the present invention.

The current $I_w$ flowing through the selected bit line 32 causes a field $$H_{bit-unselect}=1.09*10^5 I_w$$

which applies to all unselected memory elements 31, e.g. MTJ stacks, lying on the same bit line 32 (see FIG. 11). This field is quite small because the bit line 32 is buried rather far away from the free layer 80 of the magnetoresistive memory element 31, e.g. MTJ stack, (in the calculation, see also FIG. 6, 1450 nm is supposed to be the vertical distance between the free layer 80 and the bit line 32). The in-plane component of this field is $$H_{inplane}=1.08*10^5 I_w$$

This field is parallel with the easy axis of the free layer 80. The perpendicular component is negligibly smaller and certainly plays no important rule due to the large sheet anisotropy of the free layer 80. In addition, the unselected magnetoresistive memory elements 31, e.g. MTJ stacks, are also exposed to a small field $$H_{U-unselect} = \frac{2.55}{12.5}*10^6 I_w$$
$$= 0.2*10^6 I_w$$

oriented at 45° (see FIG. 11, top view). This field is created by sneak currents flowing through the U-shaped bridge 34, therefore it is 12.5 times smaller than the field created at the selected memory cell 30. The resultant field $H_{total-unselect}$ applying on the unselected memory elements 31, e.g. MTJ stacks, is finally $2.87*10^5 I_w$ and oriented at 29.5° with respect to the easy axis. This field sets the minimum switching field for all cells. That means all the cells must have the switching field at 29.5° larger than $2.87*10^5 I_w$ in order to avoid undesired over-writing. From the astroid curve (FIG. 1), it was found that the corresponding minimum switching field at 0° must be $5.47*10^5 I_w$. Combining with the maximum field requirement which has been given earlier, the selection window in the current design can be expressed as (see FIG. 12):

$$H_{s-max}=9.32*H_{s-min}$$

Figure 2:
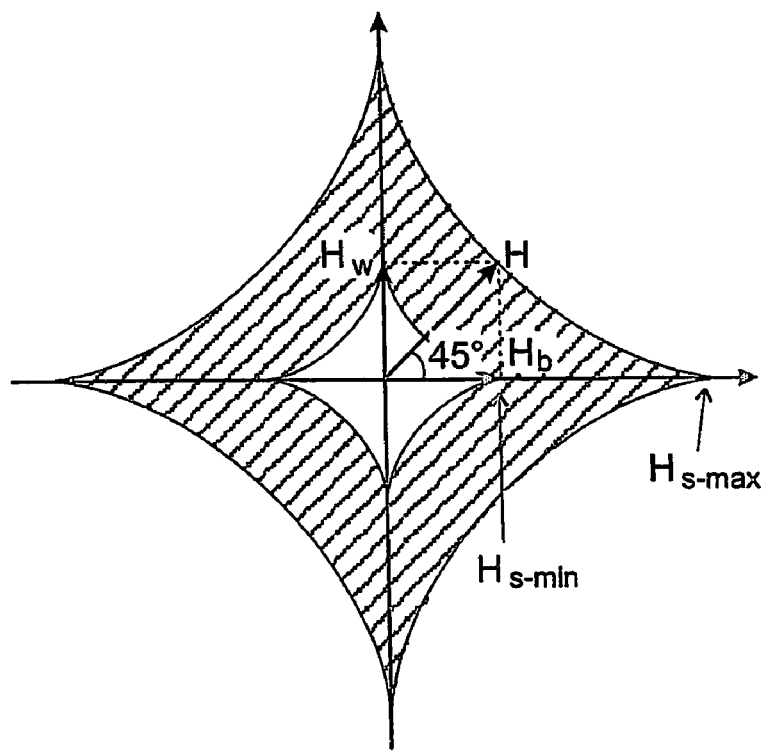
FIG. 2 illustrates the selectivity window in a matrix of magnetoresistive memory cells according to the prior art.
Figure 12:
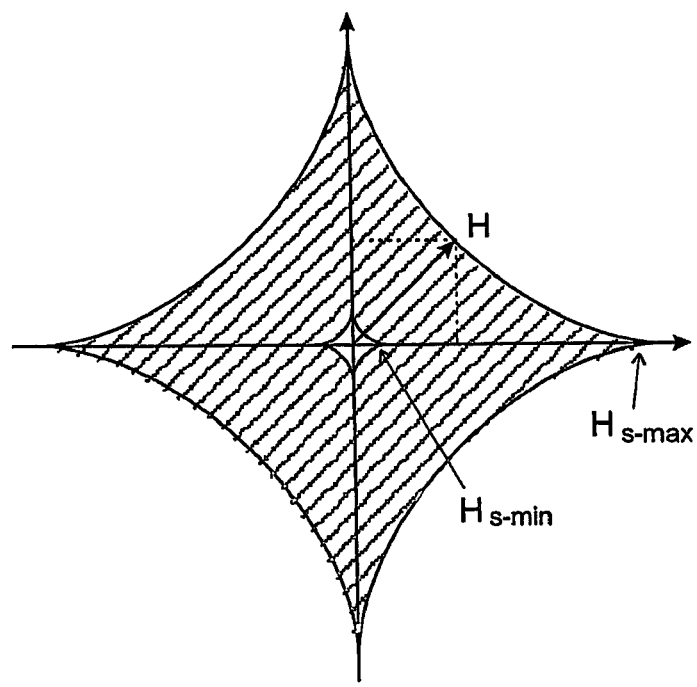
FIG. 12 illustrates the selectivity window in a matrix of magnetoresistive memory cells according to the present invention.

Comparing the cases of FIG. 2 and FIG. 12, it can be seen that the selectivity in the present design is drastically improved, by a factor of 2.26 times. Moreover, the probability for undesired overwriting, if any, is reduced to about half because statistically only half of the unselected cells lying on the same row and half of those lying on the same column are exposed to the sneak write current.

Partly forming a loop, the U-shaped bridge 34 still has very low self-inductance, which will not affect the high frequency performance of the magnetoresistive memory. Rough calculations show that the inductance of the bridge 34, excluding the straight part of the conduction line, is about $10^{-13}$-$10^{-11}$ H. This value is still about two orders of magnitude smaller than that of a single-turn recording head, which can operate at 1 GHz without problems.

Figure 13:
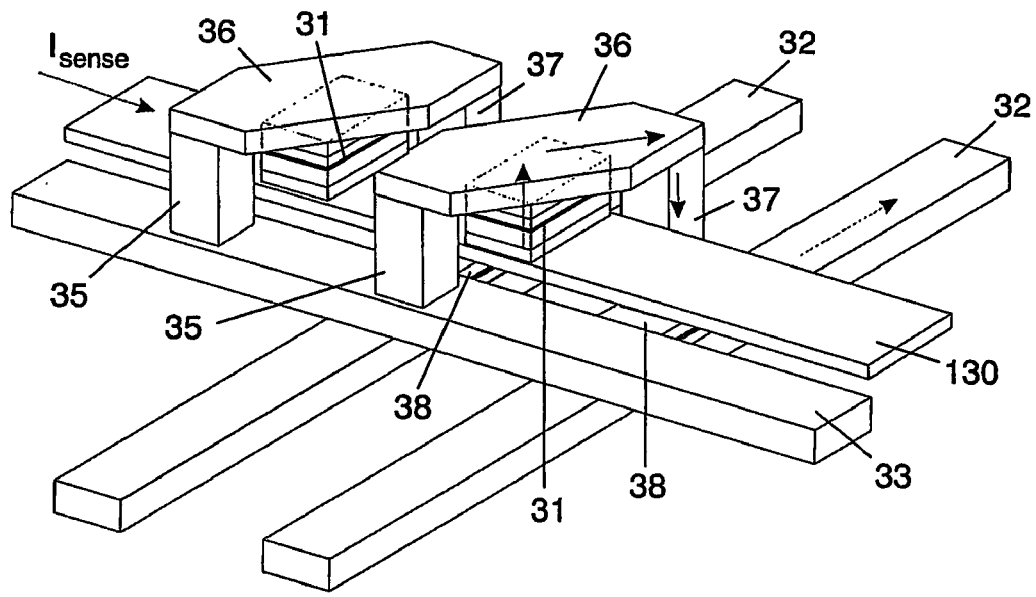
FIG. 13 is a perspective view of an MRAM memory cell according to a second embodiment of the present invention.

An alternative embodiment of a device according to the present invention is shown in FIG. 13. The architecture of this embodiment is basically the same as the first embodiment shown in FIG. 3. The difference is that there is no selection transistor T for every memory 30 cell. Therefore, the third via 39 as in FIG. 3 is not present. Instead, a sense line 130 is patterned into the conductive layer underneath the bottom electrode of the magnetoresistive memory element 31. The sense line 130 connects the bottom electrodes of all magnetoresistive memory elements 31 lying on the same word line 33 with each other. In other words, each sense line 130 is associated with a row of magnetoresistive memory elements 31, just like a word line 33 is. These sense lines 130, together with the bit lines 32, are used when reading. The separation device 38 is now again, during read-out, connected in series with the magnetoresistive memory element 31, such as e.g. an MTJ, and can act to block sneak currents during reading, as described above. The operation is similar to what was described in U.S. Pat. No. 6,331,944. Reading, for instance of the cell $i^{th}$, is carried out by sending a sense current through the sense line 130 associated with selected memory cell $i^{th}$, through the magnetoresistive memory element 31 of cell $i^{th}$, through the top bar 36, the second via 37, the separation device 38, and finally it goes out via bit line 32 associated with the selected memory cell $i^{th}$. This sense current will sense the resistance of the memory cell $i^{th}$, or thus of the memory element 31 of that cell, and the digital state of the memory cell $i^{th}$ can be detected.

Figure 14:
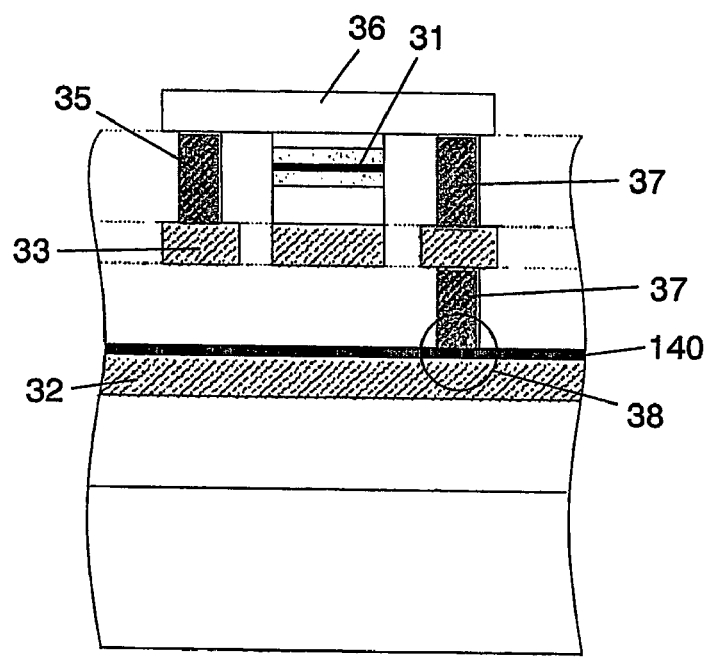
FIG. 14 is a side view of an MRAM memory cell according to a third embodiment of the present invention.

A third embodiment is similar to the second one. The difference is how the separation devices 38 are made. Instead of depositing a sandwich film of metal-barrier-metal and patterning it, in the current embodiment a continuous barrier layer 140 is deposited on the polished surface of bit lines 32, and then without patterning, second via's 37 are created on top of the barrier layer 140 (FIG. 14). In this case, the bit lines 32 and second via's 37 act as the two metal electrodes of the structure metal-barrier-metal. With this design, an extra mask for patterning the separation devices 38 can be omitted.

Figure 15:
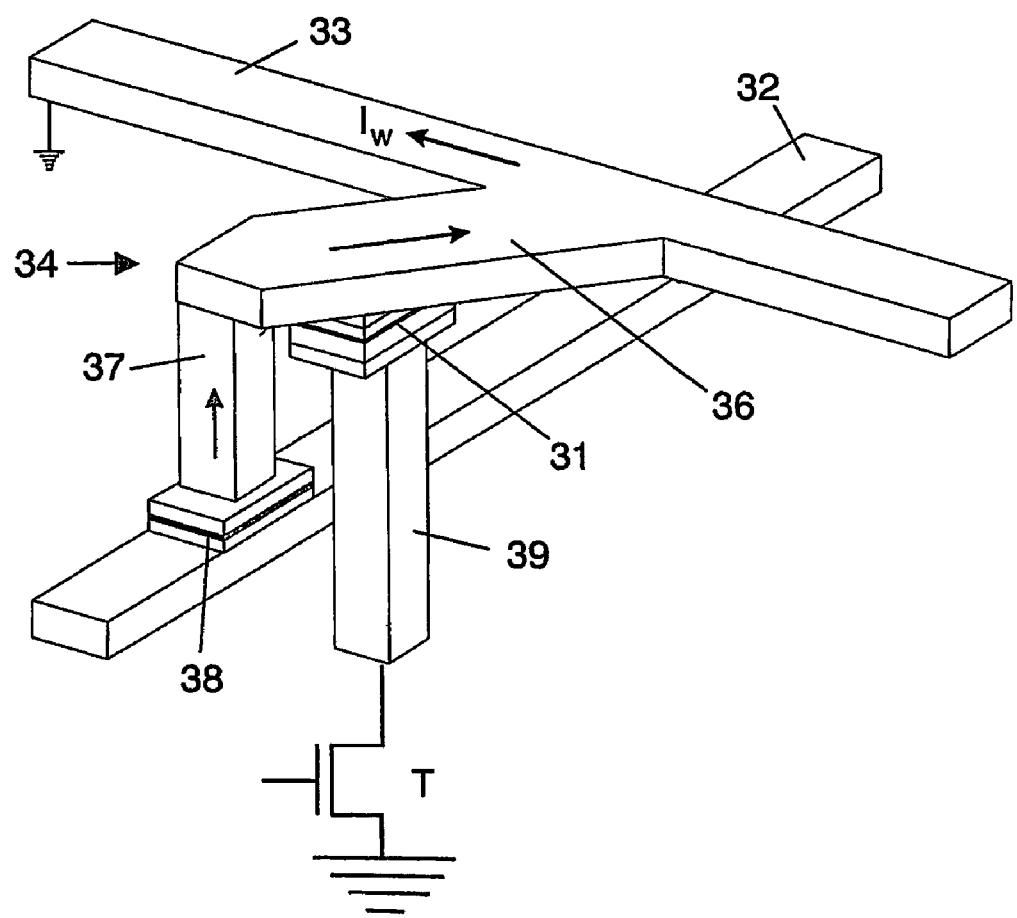
FIG. 15 is a perspective view of an MRAM memory cell according to a fourth embodiment of the present invention.
Figure 16:
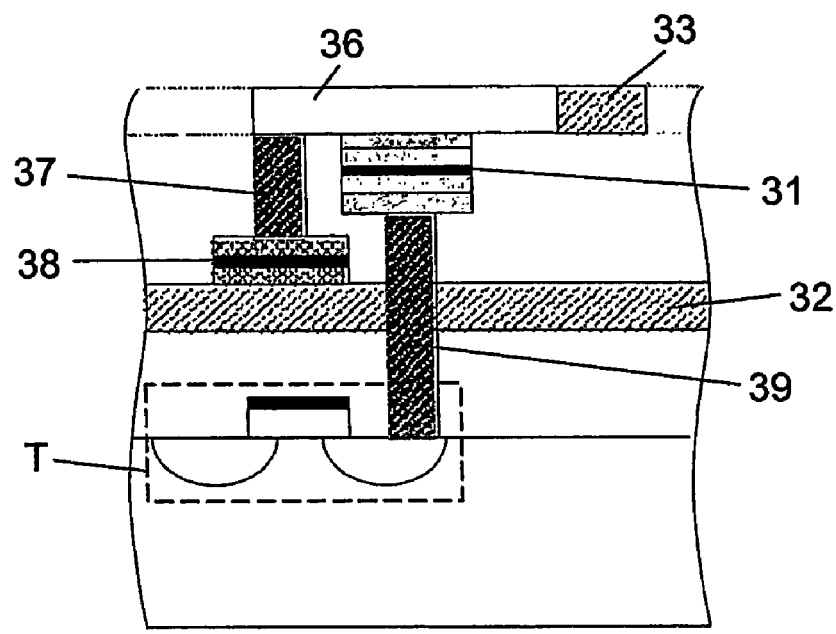
FIG. 16 is a side view of a memory cell as in FIG. 15.
Figure 17:
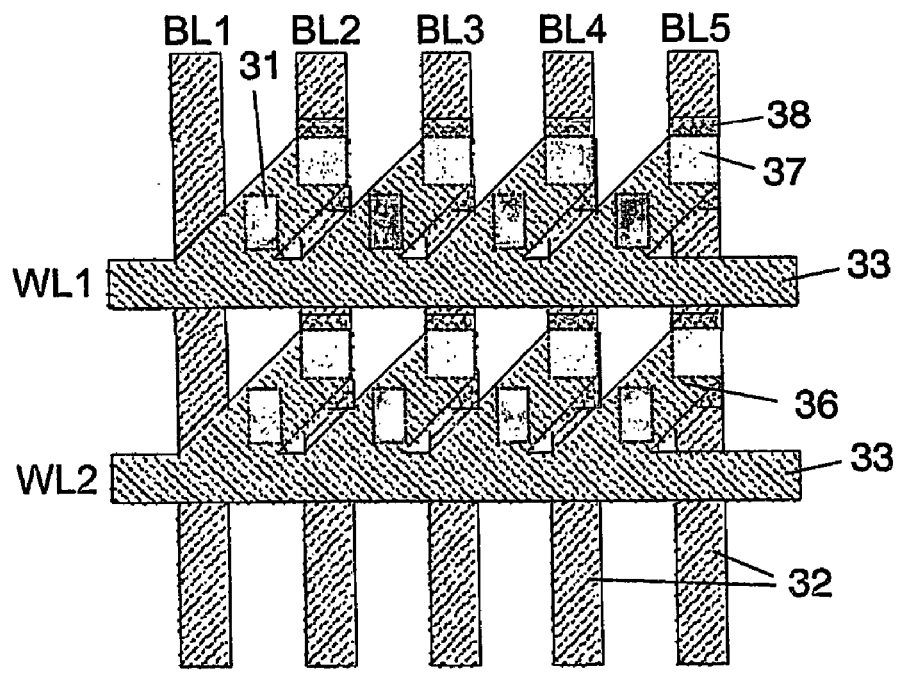
FIG. 17 is a is a top view of an MRAM memory comprising a plurality of memory cells as in FIG. 15.

A fourth embodiment is illustrated in FIG. 15 to FIG. 17, which show a perspective view, a side view and a top view, respectively. In this embodiment, bridging element 34 is an L-shaped bridge, i.e. it comprises as a first component top bar 36, lying in a plane which is parallel to the plane of the word line 33 or bit line 32, and as a second component via 37, perpendicular to top bar 36. The top bar 36 is patterned in the same level or same metal layer as the word line 33. The magnetoresistive memory element, e.g. MTJ element 31, is placed in between the $1^{st}$ and the $2^{nd}$ metal layer, being the metal layers in which the bit lines 32 and the word lines 33 have been patterned. In this embodiment the magnetic field generated at the MTJ element 31 is smaller than the magnetic field created with the devices of the other embodiments, because in this case, the magnetic field is created by only 2 segments of the bridging element 34: via 37 and top bar 36. Besides, the combination of the device according to the fourth embodiment with the teaching of the second embodiment can be applied. That means that a sense line can be put underneath the MTJ element 31 for use when reading. It is to be understood that although preferred embodiments, specific constructions and configurations, as well as materials, have been discussed herein for devices according to the present invention, various changes or modifications in form and detail may be made without departing from the scope and spirit of this invention. For example the separation device 38 might be located just underneath the top bar 36 of the bridging element 34, at the upper end of via 37. Some other possibilities have already been mentioned in the description hereinabove.

The invention claimed is:

1. Magnetoresistive memory cell, comprising a magnetoresistive memory element, a first current line and a second current line, the first and the second current line crossing each other at a cross-point region but not being in direct contact, wherein a bridging element connects the first and second current lines in the vicinity of the cross-point region, the bridging element is magnetically couplable to the magnetoresistive memory element, and the bridging element comprises at least a first component which lies in a plane parallel to the first and second current lines and a second component which is perpendicular thereto.

2. Magnetoresistive memory cell according to claim 1, wherein the bridging element is a conductive structure.

3. Magnetoresistive memory cell according to claim 1, there being a separation device between the bridging element and the first current line or between the bridging element and the second current line.

4. Magnetoresistive memory cell according to claim 1, there being a separation device in between components of the bridging element.

5. Magnetoresistive memory cell according to claim 3, wherein the separation device has a non-linear current-voltage characteristic.

6. Magnetoresistive memory cell according to claim 5, wherein the separation device has a symmetric non-linear current-voltage characteristic.

7. Magnetoresistive memory cell according to claim 1, the bridging element having a center point, wherein the magnetoresistive memory element is located at the center point of the bridging element.

8. Matrix of magnetoresistive memory cells, each magnetoresistive memory cell comprising a magnetoresistive memory element, the magnetoresistive memory cells being linked together to form logically organized rows and columns, each row being provided with a first current line and each column being provided with a second current line, the first and the second current lines crossing each other at cross-point regions, wherein bridging elements connect the first and second current lines in the vicinity of the cross-point regions, and the bridging elements are magnetically couplable to the magnetoresistive memory elements and each bridging element comprises at least a first component which lies in a plane parallel to the first and second current lines and a second component which is perpendicular thereto.

9. Matrix according to claim 8, wherein every memory cell is provided with a selection transistor.

10. Matrix according to claim 8, wherein every row of memory cells is provided with a sense line.

11. Method of writing a value in a matrix of magnetoresistive memory cells, each magnetoresistive memory cell comprising a magnetoresistive memory element, the magnetoresistive memory cells being linked together to form logically organized rows and columns, each row being provided with a first current line and each column being provided with a second current line, the first and the second current lines crossing each other at a cross-point regions in the memory cells, each memory cell being provided with a bridging element conductively connecting the first current line and the second current line, the method comprising sending a current through a selected first current line, through a selected bridging element and through a selected second current line, the bridging element conductively connecting the first current line and the second current line through a separation device, the method furthermore comprising sending current through the separation device and wherein the bridging element comprises at least a first component which lies in a plane parallel to the first and second current lines and a second component which is perpendicular thereto.

* * * * *